(12) United States Patent
Enslin et al.

(10) Patent No.: US 10,816,609 B2
(45) Date of Patent: Oct. 27, 2020

(54) OPEN CIRCUIT DETECTION FOR VEHICLE POWER SYSTEM

(71) Applicant: Ford Global Technologies, LLC, Dearborn, MI (US)

(72) Inventors: Heinrich Enslin, Dearborn, MI (US); Jeffery R. Grimes, Canton, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 165 days.

(21) Appl. No.: 16/055,960

(22) Filed: Aug. 6, 2018

(65) Prior Publication Data
US 2020/0041558 A1 Feb. 6, 2020

(51) Int. Cl.
| G01R 31/00 | (2006.01) |
| G01R 31/50 | (2020.01) |
| G01R 19/25 | (2006.01) |
| H02H 7/122 | (2006.01) |
| G01R 31/08 | (2020.01) |
| H02H 11/00 | (2006.01) |

(52) U.S. Cl.
CPC ......... *G01R 31/50* (2020.01); *G01R 19/2513* (2013.01); *G01R 31/007* (2013.01); *G01R 31/083* (2013.01); *H02H 7/1227* (2013.01); *H02H 11/007* (2013.01)

(58) Field of Classification Search
USPC .......................... 324/424, 503, 713; 361/42
See application file for complete search history.

(56) References Cited

U.S. PATENT DOCUMENTS

| 5,530,360 | A | 6/1996 | Kerchaert et al. |
| 6,144,903 | A | 11/2000 | Tousignant |
| 7,282,921 | B2 | 10/2007 | Sela et al. |
| 9,239,350 | B2 | 1/2016 | Julson |
| 2019/0148929 | A1* | 5/2019 | Wang ..................... B60L 50/10 361/42 |

* cited by examiner

*Primary Examiner* — Vincent Q Nguyen
(74) *Attorney, Agent, or Firm* — Frank Lollo; Eversheds Sutherland (US) LLP

(57) ABSTRACT

A vehicle power system includes an inverter, outlets, and circuit breakers. The inverter supplies power to the outlets through the circuit breakers. The inverter, in response to detecting no voltage at designated amount and combination of the outlets, based on the designated amount and combination, generates a signal indicating that one or more of electrical paths to the outlets has failed or one or more of the circuit breakers is open.

18 Claims, 2 Drawing Sheets

US 10,816,609 B2

OPEN CIRCUIT DETECTION FOR VEHICLE POWER SYSTEM

TECHNICAL FIELD

The present disclosure generally relates to an open circuit detection for a vehicle power system and, more specifically, an apparatus and method for detecting an open circuit within a vehicle power system.

BACKGROUND

Vehicles include power systems for supplying power through outlets. The power system may include circuit breakers for protecting various electronic components coupled to the outlets and/or other electronic components within the power system from excess current. When the power system is operating, and voltage is absent at one or more of the outlets, an open circuit exists within the power system.

SUMMARY

The appended claims define this application. The present disclosure summarizes aspects of the embodiments and should not be used to limit the claims. Other implementations are contemplated in accordance with the techniques described herein, as will be apparent to one having ordinary skill in the art upon examination of the following drawings and detailed description, and these implementations are intended to be within the scope of this application.

A circuit and a method for performing open circuit detection are disclosed. An example circuit includes outlets, circuit breakers coupled to the outlets, and an inverter. The inverter supplies power to the outlets through the circuit breakers. The inverter, in response to detecting no voltage at designated amount and combination of the outlets, based on the designated amount and combination, generates a signal indicating that one or more of electrical paths to the outlets has failed or one or more of the circuit breakers is open.

An example method includes supplying, via an inverter, power to outlets through circuit breakers, and responsive to detecting no voltage at designated amount and combination of the outlets, based on the designated amount and combination, generating a signal indicating that one or more of electrical paths to the outlets has failed or one or more of the circuit breakers is open.

BRIEF DESCRIPTION OF THE DRAWINGS

For a better understanding of the invention, reference may be made to embodiments shown in the following drawings. The components in the drawings are not necessarily to scale and related elements may be omitted, or in some instances proportions may have been exaggerated, so as to emphasize and clearly illustrate the novel features described herein. In addition, system components can be variously arranged, as known in the art. Further, in the drawings, like reference numerals designate corresponding parts throughout the several views.

DETAILED DESCRIPTION OF EXAMPLE EMBODIMENTS

Figure 1:
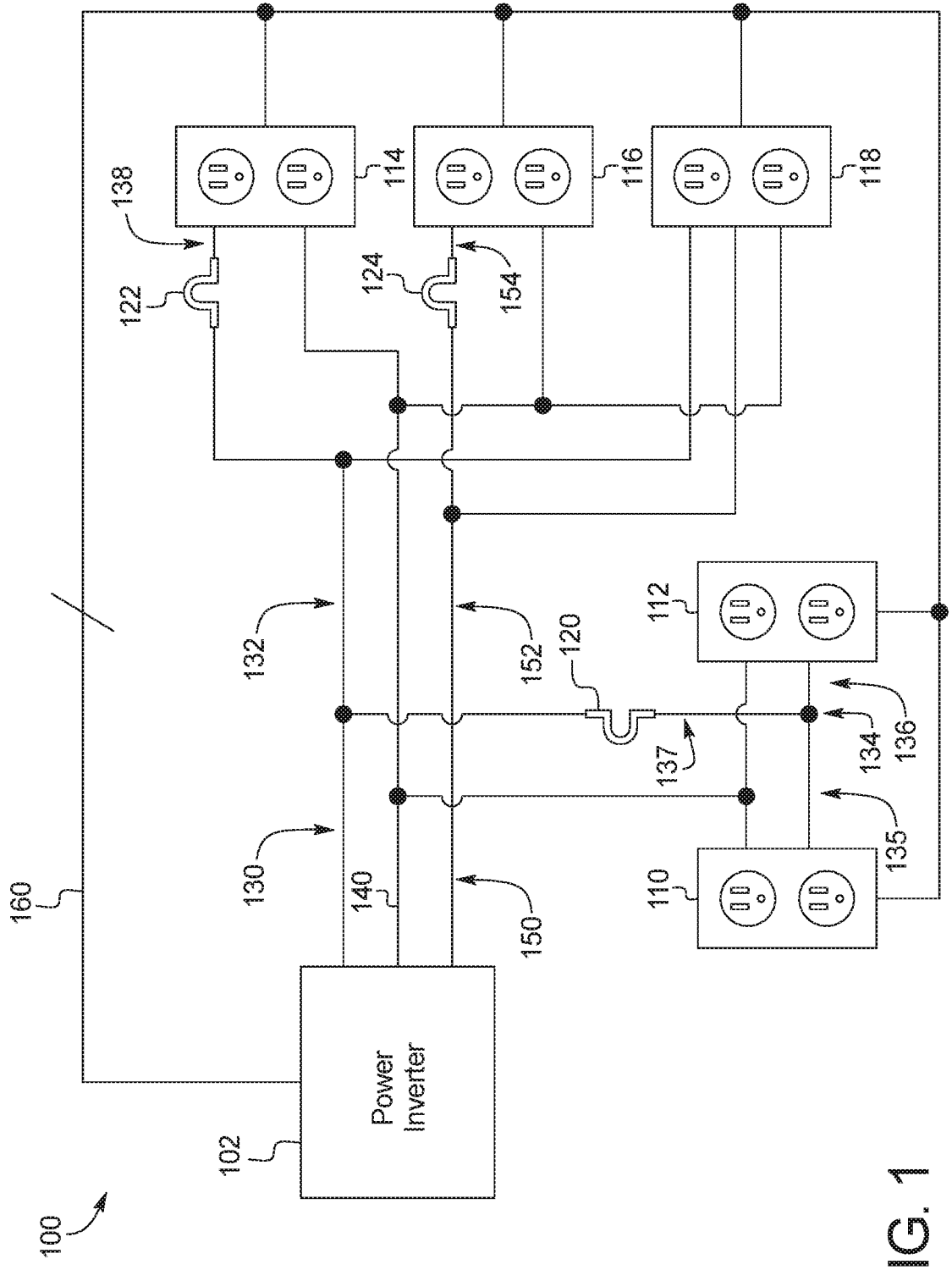
FIG. 1 illustrates a vehicle power system in accordance with this disclosure.

While the invention may be embodied in various forms, there are shown in the drawings, and will hereinafter be described, some exemplary and non-limiting embodiments, with the understanding that the present disclosure is to be considered an exemplification of the invention and is not intended to limit the invention to the specific embodiments illustrated.

Vehicles include one or more power outlets for supplying power to various electronic devices. Generally, these power outlets are connected to a power inverter. The power inverter receives a high-voltage direct current (HVDC) from a DC power source (e.g., a vehicle battery) and transforms the HDVC to an alternating current (AC). The AC is used to supply power to general electronic devices such as a cellphone, a smartphone, a handheld gaming device, etc. The power outlets include one or more circuit breakers for interrupting the current flow from the power inverter to the power outlets. These circuit breakers interrupt the AC flow when the circuit breakers detect a fault (e.g., an excess current from an overload or short circuit). An interrupted circuit breaker may be detectable by checking the voltage level at a power outlet connected to the circuit breaker. However, an absence of voltage at the power outlet may also indicate that there is a fault within an electrical path from the power inverter to the circuit breaker (e.g., a cut wire). Conventional vehicle power circuits do not include a system for distinguishing an open circuit due to a circuit fault or an open circuit breaker.

As described below, a vehicle power system includes a power inverter, a battery, circuit breakers, and outlets. The power inverter determines a voltage level at each of the outlets. If there is no voltage detected at designated amount and combination of outlets, the power inverter generates a signal indicating that: (1) one or more of electrical paths from the power inverter to the outlets has failed; or (2) one or more of the circuit breakers has opened.

FIG. 1 illustrates a vehicle power system 100 in accordance with this disclosure. In this illustrated example, the vehicle power system 100 includes a power inverter 102, a first outlet 110, a second outlet 112, a third outlet 114, a fourth outlet 116, a fifth outlet 118, a first circuit breaker 120, a second circuit breaker 122, a third circuit breaker 124, a first power line 130, a second power line 150, a neutral line 140, and a communication bus 160.

The first outlet 110 and the second outlet 112 are connected to the first power line 130 and connected to the power inverter 102 though the first circuit breaker 120. The first outlet 110 and the second outlet 112 are connected to each other in parallel via the first power line 130. Each of the first outlet 110 and the second outlet 112 includes a voltage sensing device (not shown) for detecting a voltage level at the corresponding outlet. The first outlet 110 and the second outlet 112 communicate with the power inverter 102 via the communication bus 160. Each of the first outlet 110 and the second outlet 112 transmits, to the power inverter 102, a signal indicating a voltage level detected at the corresponding outlet.

The third outlet 114 is connected to the first power line 130, the neutral line 140, and the communication bus 160. The third outlet 114 is connected to the power inverter 102 through the second circuit breaker 122. The third outlet 114 includes a voltage sensing device (not shown) for detecting a voltage level at the third outlet 114. The third outlet 114 transmits a signal indicating the voltage level of the third outlet 114 to the power inverter 102 via the communication bus 160.

The fourth outlet 116 is connected to the second power line 150, the neutral line 140, and the communication bus 160. The fourth outlet 116 is connected to the power inverter 102 through the third circuit breaker 124. The third outlet 114 includes a voltage sensing device (not shown) for detecting a voltage level at the fourth outlet 116. The fourth outlet 116 transmits a signal indicating the voltage level of the fourth outlet 116 to the power inverter 102 via the communication bus 160.

The fifth outlet 118 is connected to the first power line 130, the second power line 150, the neutral line 140, and the communication bus 160. The fifth outlet 118 may provide a voltage level greater than a voltage level provided at each of the first to fourth outlets 116 by combining voltages provided by the first power line 130 and the second power line 150. The fifth outlet 118 includes a voltage sensing device (not shown) for detecting a voltage level at the fifth outlet 118. The fifth outlet 118 transmits a signal indicating the voltage level of the fifth outlet 118 to the power inverter 102 via the communication bus 160.

The first circuit breaker 120 interrupts excess current flow to the first outlet 110 and the second outlet 112.

The second circuit breaker 122 interrupts excess current flow to the third outlet 114.

The third circuit breaker 124 interrupts excess current flow to the fourth outlet 116.

The first power line 130 includes a first node 132, a second node 134 and a third node 138. The first node 132 of the first power line 130 connects the power inverter 102, first circuit breaker 120, the second circuit breaker 122, and the fifth outlet 118. The second node 134 of the first power line 130 connects the first circuit breaker 120, the first outlet 110, and the second outlet 112. The second node 134 includes a first wire 135, a second wire 136, an and a third wire 137. The first wire 135 is connected to the first outlet 110. The second wire 136 is connected to the second outlet 112. The third wire 137 is connected to the first circuit breaker 120. The first to third wires 135, 136, and 137 are further connected to a single tripoint. The third node 138 of the first power line 130 connects the second circuit breaker 122 and the third outlet 114.

The second power line 150 includes a fourth node 152 and a fourth node. The fourth node 152 connects the power inverter 102 and the third circuit breaker 124. The fifth node 154 connects the third circuit breaker 124 and the fourth outlet 116.

The neutral line 140 is connected to the power inverter 102 and the first to fifth outlets 110, 112, 114, 116, and 118. The neutral line 140 provides a return path for a current provided by the first power line 130 and/or the second power line 150.

The communication bus 160 receives, from each of the first to fifth outlets 110, 112, 114, 116, and 118, a signal indicating the voltage level of each of the first to fifth outlets 110, 112, 114, 116, and 118.

The power inverter 102 is connected the first power line 130, the second power line 150, the neutral line 140, the communication bus 160. The power inverter 102 receives a HVDC from a DC power source, such as a vehicle battery, converts the HDVC to an AC, and transmits the AC to the first power line 130 and/or the second power line 150. The power inverter 102 may include at least one processor and/or memory (not shown). The processor or controller may be any suitable processing device or set of processing devices such as, but not limited to: a microprocessor, a microcontroller-based platform, a suitable integrated circuit, one or more field programmable gate arrays (FPGAs), and/or one or more application-specific integrated circuits (ASICs). The memory may be volatile memory (e.g., RAM, which can include non-volatile RAM, magnetic RAM, ferroelectric RAM, and any other suitable forms); non-volatile memory (e.g., disk memory, FLASH memory, EPROMs, EEPROMs, non-volatile solid-state memory, etc.), unalterable memory (e.g., EPROMs), read-only memory, and/or high-capacity storage devices (e.g., hard drives, solid state drives, etc). In some examples, the memory includes multiple kinds of memory, particularly volatile memory and non-volatile memory. The memory is computer readable media on which one or more sets of instructions, such as the software for operating the methods of the present disclosure can be embedded. The instructions may embody one or more of the methods or logic as described herein. In a particular embodiment, the instructions may reside completely, or at least partially, within any one or more of the memory, the computer readable medium, and/or within the processor during execution of the instructions.

The terms "non-transitory computer-readable medium" and "tangible computer-readable medium" should be understood to include a single medium or multiple media, such as a centralized or distributed database, and/or associated caches and servers that store one or more sets of instructions. The terms "non-transitory computer-readable medium" and "tangible computer-readable medium" also include any tangible medium that is capable of storing, encoding or carrying a set of instructions for execution by a processor or that cause a system to perform any one or more of the methods or operations disclosed herein. As used herein, the term "tangible computer readable medium" is expressly defined to include any type of computer readable storage device and/or storage disk and to exclude propagating signals.

The power inverter 102 receives the signal transmitted from each of the first to fifth outlets 110, 112, 114, 116, and 118 via the communication bus 160. Based on the received signals, the power inverter 102 performs an open circuit detection to determine whether one or more of electrical paths from the power inverter 102 to the first to fifth outlets 110, 112, 114, 116, and 118 have failed, or one or more of the first to third circuit breakers 120, 122, and 124 have opened.

For example, when the power inverter 102 detects an absence of voltage in the first outlet 110, the power inverter 102 determines that there is a circuit fault within the first wire 135.

When the power inverter 102 detects an absence of voltage in the second outlet 112, the power inverter 102 determines that there is a circuit fault within the second wire 136.

When the power inverter 102 detects an absence of voltage in the first outlet 110 and the second outlet 112, the power inverter 102 determines that the first circuit breaker 120 has opened. In some examples, the power inverter 102 may further determine that there is a fault within the third wire 137.

When the power inverter 102 detects an absence of voltage in the third outlet 114, the power inverter 102 determines that the second circuit breaker 122 has opened. In some examples, the power inverter 102 may further determine that there is a fault within the third node 138.

When the power inverter 102 detects an absence of voltage in the fourth outlet 116, the power inverter 102 determines that the third circuit breaker 124 has opened. In some examples, the power inverter 102 may further determine that there is a fault within the fifth node 154.

When the power inverter 102 detects an absence of voltage in the third outlet 114 and the fifth outlet 118, the power inverter 102 determines that there is a circuit fault within the first node 132.

When the power inverter 102 detects an absence of voltage in the fourth outlet 116 and the fifth outlet 118, the power inverter 102 determines that there is a circuit fault within the fourth node 152.

In some examples, when the power inverter 102 detects a voltage at the third outlet 114 and an absence of voltage in the fifth outlet 118, the power inverter 102 may determine that there is circuit fault within a wire connecting the fifth outlet 118 to a node connecting the power inverter 102 and the second circuit breaker 122.

In some examples, when the power inverter 102 detects a voltage at the fourth outlet 116 and an absence of voltage in the fifth outlet 118, the power inverter 102 may determine that there is circuit fault within a wire that connecting the fifth outlet 118 to a node connecting the power inverter 102 and the third circuit breaker 124.

Subsequent to the determination, the power inverter 102 transmits a signal to one or more electronic control units (ECU) within the vehicle. The one or more ECUs presents, via a device (e.g., a display device, a vehicle speaker system, and/or a mobile device communicatively coupled to the one or more ECUs), a report based on the open circuit detection.

The open circuit detection is not limited to the circuit as illustrated in FIG. 1. The power inverter 102 can distinguish an open circuit due to a circuit fault or an open circuit breaker based on location(s) of one or more circuit breakers with respect to the power inverter 102 and location(s) of at least one referential voltage testing point with respect to the power inverter 102.

For example, the power inverter 102 may conduct the open circuit detection for a circuit including a circuit breaker and a plurality of outlets, where the circuit breaker is connected to a node shared by the plurality of outlets. If the power inverter 102 detects an absence of voltage in at least one of the plurality of outlets, but not all of the plurality of outlets, the power inverter 102 determines that there is at least one circuit fault within the node. If the power inverter 102 detects an absence of voltage in all of the plurality of outlets, the power inverter 102 determines that the circuit breaker is open. In such example, the referential voltage testing point is at least one of the plurality of outlets.

In another example, the power inverter 102 may conduct the open circuit detection on a circuit including a circuit breaker, a first outlet, and a a plurality of second outlets, where one end of the circuit breaker is connected to the first outlet, and the other end of the circuit breaker is connected to a node shared by the plurality of second outlets. If the power inverter 102 detects an absence of voltage in the first outlet, the power inverter 102 determines that the circuit breaker is open. If the power inverter 102 detects an absence of voltage in at least one of the plurality of second outlets, the power inverter 102 determines that there is at least one circuit fault within the node. If the power inverter 102 detects an absence of voltage in the outlet and at least one of the plurality of second outlets, the power inverter 102 determines that there is at least one circuit fault within the node. In such example, the referential voltage testing point is the at least one of the plurality of second outlets.

Figure 2:
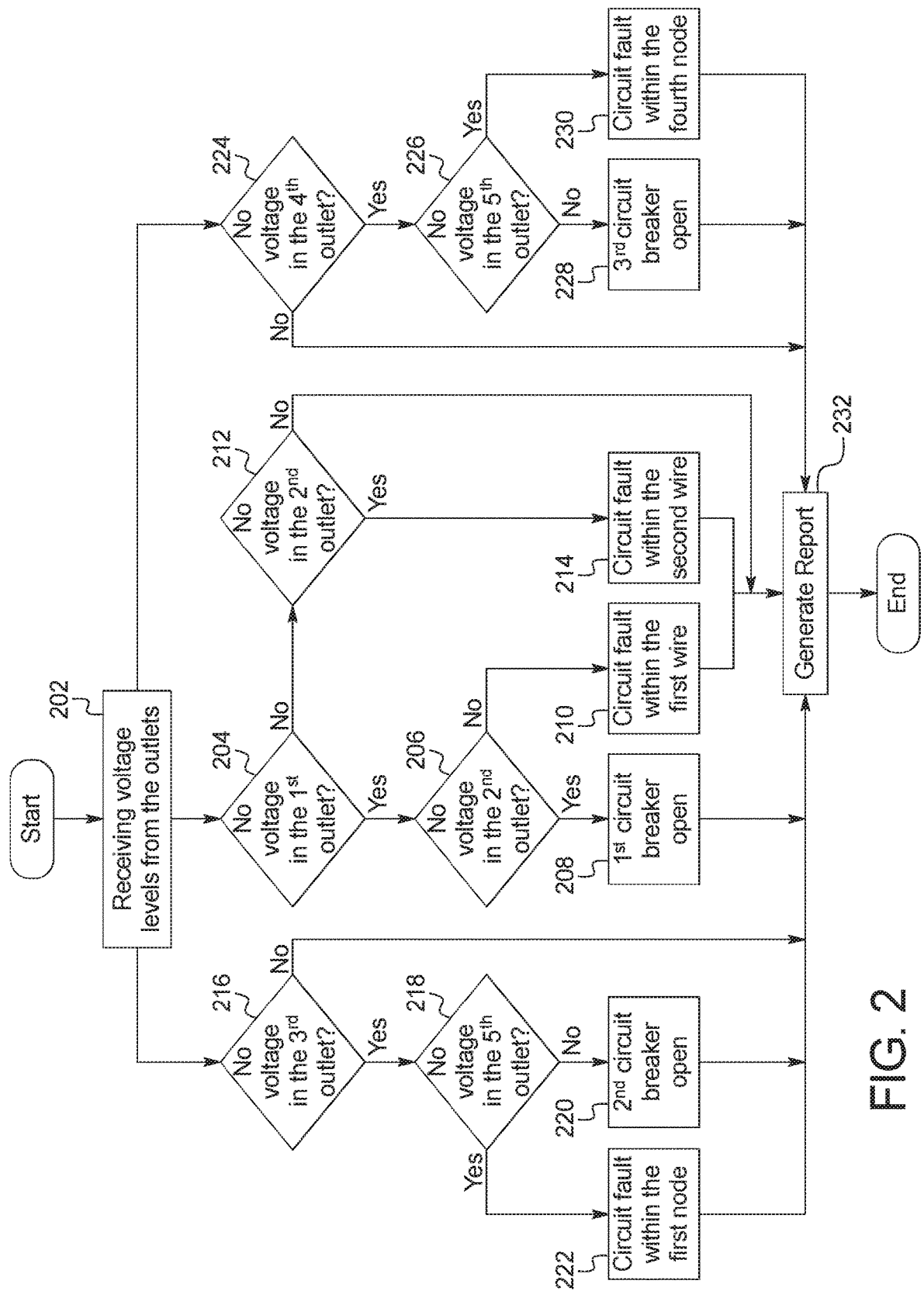
FIG. 2 is a flowchart of a method for performing an open circuit detection on the vehicle power system of FIG. 1.

FIG. 2 is a flowchart of a method for performing an open circuit detection on the vehicle power system 100 of FIG. 1.

At block 202, the power inverter 102 receives a voltage level from each of the first to fifth outlets 110, 112, 114, 116, and 118. Once the power inverter 102 receives the voltage levels, the method continues to blocks 204, 216, and 224.

At block 204, the power inverter 102 checks for the voltage level of the first outlet 110. If there is no voltage at the first outlet 110, the method continues to block 206. If there is voltage at the first outlet 110, the method continues to block 212.

At block 206, the power inverter 102 checks for the voltage level of the second outlet 112. If there is no voltage at the second outlet 112, the method continues to block 208. If there is voltage at the second outlet 112, the method continues to block 210.

At block 208, the power inverter 102 determines that the first circuit breaker 120 is open. In some examples, the power inverter 102 further determines that there is a circuit fault within the second node 134. The method continues to block 232.

At block 210, the power inverter 102 determines that there is a circuit fault within the first wire 135. The method continues to block 232.

At block 212, the power inverter 102 checks for the voltage level of the second outlet 112. If there is no voltage at the second outlet 112, the method continues to block 214. If there is voltage at the second outlet 112, the method continues to block 232.

At block 214, the power inverter 102 determines that there is a circuit fault within the second wire 136. The method continues to block 222.

At block 216, the power inverter 102 checks for the voltage level of the third outlet 114. If there is no voltage at the third outlet 114, the method continues to block 218. If there is voltage at the third outlet 114, the method continues to block 232.

At block 218, the power inverter 102 checks for the voltage level of the fifth outlet 118. If there is no voltage at the fifth outlet 118, the method continues to block 222. If there is voltage at the fifth outlet 118, the method continues to block 220.

At block 220, the power inverter 102 determines that the second circuit breaker 122 is open. In some examples, the power inverter 102 further determines that there is a circuit fault within the third node 138. The method continues to block 232.

At block 222, the power inverter 102 determines that there is a circuit fault within the first node 132. The method continues to block 232.

At block 224, the power inverter 102 checks for the voltage level of the fourth outlet 116. If there is no voltage at the fourth outlet 116, the method continues to block 226. If there is voltage at the fourth outlet 116, the method continues to block 232.

At block 226, the power inverter 102 checks for the voltage level of the fifth outlet 118. If there is no voltage at the fifth outlet 118, the method continues to block 230. If there is voltage at the fifth outlet 118, the method continues to block 228.

At block 228, the power inverter 102 determines that the third circuit breaker 124 is open. In some examples, the power inverter 102 further determines that there is a circuit fault within the fifth node 154.

At block 230, the power inverter 102 determines that there is a circuit fault within the fourth node 152.

At block 232, the power inverter 102 generates a report based on the determinations made in blocks 208, 210, 214, 220, 222, 228, and 230.

Although the example method is/are described with reference to the flowchart illustrated in FIG. 2, many other methods of performing an open circuit detection may alternatively be used. For example, the order of execution of the blocks may be changed, and/or some of the blocks described may be changed, eliminated, or combined.

In this application, the use of the disjunctive is intended to include the conjunctive. The use of definite or indefinite articles is not intended to indicate cardinality. In particular, a reference to "the" object or "a" and "an" object is intended to denote also one of a possible plurality of such objects. Further, the conjunction "or" may be used to convey features that are simultaneously present instead of mutually exclusive alternatives. In other words, the conjunction "or" should be understood to include "and/or". As used here, the terms "module" and "unit" refer to hardware with circuitry to provide communication, control and/or monitoring capabilities, often in conjunction with sensors. "Modules" and "units" may also include firmware that executes on the circuitry. The terms "includes," "including," and "include" are inclusive and have the same scope as "comprises," "comprising," and "comprise" respectively.

The above-described embodiments, and particularly any "preferred" embodiments, are possible examples of implementations and merely set forth for a clear understanding of the principles of the invention. Many variations and modifications may be made to the above-described embodiment(s) without substantially departing from the spirit and principles of the techniques described herein. All modifications are intended to be included herein within the scope of this disclosure and protected by the following claims.

What is claimed is:

1. A circuit comprising:
    outlets;
    circuit breakers coupled to the outlets; and
    an inverter configured to:
        supply power to the outlets through the circuit breakers; and
        responsive to detecting no voltage at designated amount and combination of the outlets, based on the designated amount and combination, generate a signal indicating that one or more of electrical paths from the inverter to the outlets has failed or one or more of the circuit breakers is open,
    wherein the circuit breakers comprise a first circuit breaker, wherein the first circuit breaker comprises two ends, wherein the outlets comprise a first outlet and a second outlet, wherein one end of the first circuit breaker is coupled to the first outlet and the other end of the first circuit breaker is coupled to the inverter and the second outlet via a first node, and wherein the inverter is further configured to, responsive to detecting no voltage at the first outlet and the second outlet, determine that the first node includes a circuit fault.

2. The circuit of claim 1, wherein a second circuit breaker of the circuit breakers is coupled to a subset of the outlets that are connected in parallel, and wherein the inverter is further configured to, responsive to detecting no voltage at the subset of the outlets, determine that the second circuit breaker is open.

3. The circuit of claim 2, wherein the subset of the outlets comprises a third outlet and a fourth outlet, and wherein the second circuit breaker and the subset of the outlets are coupled by a second node, the second node comprising:
    a first wire connected to the third outlet;
    a second wire connected to the fourth outlet; and
    a third wire connected to the second circuit breaker, wherein the first wire, the second wire, and the third wire are connected to each other, wherein the inverter is further configured to:
        responsive to detecting no voltage at the third outlet and detecting voltage at the fourth outlet, determine that the first wire includes the circuit fault; and
        responsive to detecting no voltage at the fourth outlet and detecting voltage at the third outlet, determine that the second wire includes the circuit fault.

4. The circuit of claim 3, wherein the inverter is further configured to, responsive to detecting no voltage at the subset of the outlets, determine that the third wire includes the circuit fault.

5. The circuit of claim 1, wherein the inverter is further configured to, responsive to detecting no voltage at the first outlet and detecting voltage at the second outlet, determine that the first circuit breaker is open.

6. The circuit of claim 1, further comprising:
    a first power line comprising the first node and a second node; and
    a second power line comprising a third node,
    wherein the outlets further comprises a third outlet, a fourth outlet, and a fifth outlet,
    wherein the circuit breakers further comprises, a second circuit breaker and a third circuit breaker,
    wherein the inverter, the first circuit breaker, the second circuit breaker, and the second outlet are coupled to each other via the first node,
    wherein the third outlet and the fourth outlet are coupled to each other via the second node, and
    wherein the inverter, the third circuit breaker, and the second outlet are coupled to each other via the third node.

7. The circuit of claim 6, wherein the inverter is further configured to:
    responsive to detecting no voltage at the third outlet and the fourth outlet, determine that the second circuit breaker is open;
    responsive to detecting no voltage at one of the third outlet and the fourth outlet and detecting voltage at the other one of the third outlet and the fourth outlet, determine that the second node includes the circuit fault;
    responsive to detecting no voltage at the first outlet and the second outlet, determine that the first node includes the circuit fault;
    responsive to detecting no voltage at the first outlet and detecting voltage at the second outlet, determine that the first circuit breaker is open;
    responsive to detecting no voltage at the second outlet and the fifth outlet, determine that the third node includes the circuit fault; and
    responsive to detecting no voltage at the fifth outlet and the detecting voltage at the second outlet, determine that the third circuit breaker is open.

8. The circuit of claim 1, further comprising a communication bus, the communication bus coupled to the inverter and each of the outlets, wherein the communication bus is configured to transmit information regarding a voltage level at each of the outlets.

9. The circuit of claim 1, wherein the inverter is further configured to transmit the signal to one or more electronic control units (ECU) within a vehicle.

10. A method of open circuit detection for a power system, comprising:
    supplying, via an inverter, power to outlets through circuit breakers;
    responsive to detecting no voltage at designated amount and combination of the outlets, based on the designated amount and combination, generating a signal indicating that one or more of electrical paths from the inverter to the outlets has failed or one or more of the circuit breakers is open, wherein the circuit breakers comprise a first circuit breaker, wherein the first circuit breaker comprises two ends, wherein the outlets comprises a first outlet and a second outlet, and wherein one end of the first circuit breaker is coupled to the first outlet and the other end of the first circuit breaker is coupled to the inverter and the second outlet via a first node; and responsive to detecting no voltage at the first outlet and the second outlet, determining that the first node includes a circuit fault.

11. The method of claim 10, wherein a second circuit breaker of the circuit breakers is coupled to a subset of the outlets that are connected in parallel, the method further comprising, responsive to detecting no voltage at the subset of the outlets, determining that the second circuit breaker is open.

12. The method of claim 11, wherein the subset of the outlets comprises a third outlet and a fourth outlet, wherein the second circuit breaker and the subset of the outlets are coupled by a second node, the second node comprising:

a first wire connected to the third outlet;
a second wire connected to the fourth outlet; and
a third wire connected to the second circuit breaker, wherein the first wire, the second wire, and the third wire are connected to each other, the method further comprising:

responsive to detecting no voltage at the third outlet and detecting voltage at the fourth outlet, determining that the first wire includes the circuit fault; and responsive to detecting no voltage at the fourth outlet and detecting voltage at the third outlet, determining that the second wire includes the circuit fault.

13. The method of claim 12, the method further comprising, responsive to detecting no voltage at the subset of the outlets, determining that the third wire includes the circuit fault.

14. The method of claim 10, the method further comprising, responsive to detecting no voltage at the first outlet and detecting voltage at the second outlet, determining that the first circuit breaker is open.

15. The method of claim 10, wherein the power system comprises:

a first power line comprising the first node and a second node; and a second power line comprising a third node, wherein the outlets further comprises a third outlet, a fourth outlet, and a fifth outlet, wherein the circuit breakers further comprises a second circuit breaker and a third circuit breaker, wherein the inverter, the first circuit breaker, the second circuit breaker, and the second outlet are coupled to each other via the first node, wherein the third outlet and the fourth outlet are coupled to each other via the second node, and wherein the inverter, the third circuit breaker, and the second outlet are coupled to each other via the third node.

16. The method of claim 15, the method further comprising:

responsive to detecting no voltage at the third outlet and the fourth outlet, determining that the second circuit breaker is open;

responsive to detecting no voltage at one of the third outlet and the fourth outlet and detecting voltage at the other one of the third outlet and the fourth outlet, determining that the second node includes the circuit fault;

responsive to detecting no voltage at the first outlet and the second outlet, determining that the first node includes the circuit fault;

responsive to detecting no voltage at the first outlet and detecting voltage at the second outlet, determining that the first circuit breaker is open;

responsive to detecting no voltage at the second outlet and the fifth outlet, determining that the third node includes the circuit fault; and responsive to detecting no voltage at the fifth outlet and the detecting voltage at the second outlet, determining that the third circuit breaker is open.

17. The method of claim 10, the power system further comprising a communication bus, the communication bus coupled to the inverter and each of the outlets, the method further comprising transmitting, via the communication bus, information regarding a voltage level at each of the outlets.

18. The circuit of claim 10, the method further comprising transmitting the signal to one or more electronic control units (ECU) within a vehicle.

* * * * *